United States Patent
Slater, Jr. et al.

(10) Patent No.: US 7,855,459 B2
(45) Date of Patent: Dec. 21, 2010

(54) MODIFIED GOLD-TIN SYSTEM WITH INCREASED MELTING TEMPERATURE FOR WAFER BONDING

(75) Inventors: David B. Slater, Jr., Durham, NC (US); John A. Edmond, Cary, NC (US); Hua-Shuang Kong, Cary, NC (US)

(73) Assignee: Cree, Inc., Durham, NC (US)

( * ) Notice: Subject to any disclaimer, the term of this patent is extended or adjusted under 35 U.S.C. 154(b) by 728 days.

(21) Appl. No.: 11/534,317

(22) Filed: Sep. 22, 2006

(65) Prior Publication Data

US 2008/0073665 A1    Mar. 27, 2008

(51) Int. Cl.
*H01L 23/48* (2006.01)

(52) U.S. Cl. .................. 257/772; 257/766

(58) Field of Classification Search ............ 257/750, 257/761, 766, 772; 228/179.1, 180.1, 180.21, 228/180.22

See application file for complete search history.

(56) References Cited

U.S. PATENT DOCUMENTS

| | | | |
|---|---|---|---|
| 3,648,357 | A | 3/1972 | Green, Jr. |
| 4,418,857 | A | 12/1983 | Ainslie et al. |
| 5,197,654 | A | 3/1993 | Katz et al. |
| 5,234,153 | A | 8/1993 | Bacon et al. |
| 5,794,839 | A * | 8/1998 | Kimura et al. ........... 228/123.1 |
| 6,250,541 | B1 | 6/2001 | Shangguan et al. |
| 6,335,263 | B1 | 1/2002 | Cheung et al. |
| 6,527,881 | B2 | 3/2003 | Kanematsu et al. |
| 6,691,911 | B2 * | 2/2004 | Iwai et al. ................ 228/124.6 |
| 6,744,142 | B2 | 6/2004 | Lie et al. |
| 6,930,389 | B2 | 8/2005 | Huang |
| 7,023,089 | B1 | 4/2006 | Lu |
| 7,168,608 | B2 * | 1/2007 | Mei ............................ 228/254 |
| 2001/0004534 | A1 | 6/2001 | Carter-Coman et al. |
| 2002/0045330 | A1 | 4/2002 | Angst et al. |
| 2004/0201029 | A1 * | 10/2004 | Yamane et al. ................ 257/99 |
| 2004/0232439 | A1 | 11/2004 | Gibb et al. |
| 2005/0072835 | A1 | 4/2005 | Choi et al. |
| 2006/0049411 | A1 | 3/2006 | Nakamura et al. |
| 2006/0060872 | A1 | 3/2006 | Edmond et al. |
| 2006/0060874 | A1 | 3/2006 | Edmond et al. |
| 2006/0060877 | A1 | 3/2006 | Edmond et al. |

(Continued)

FOREIGN PATENT DOCUMENTS

JP    2006-140186    6/2006

OTHER PUBLICATIONS

He et al, "Pulse Plating of Gold-Tin Alloys for Microelectronic and Optoelectronic Applications," Plating and Surface Finishing ISSN 0360-3164, 2002, vol. 89, pp. 48-53.

(Continued)

*Primary Examiner*—Kevin M Picardat
(74) *Attorney, Agent, or Firm*—Myers Bigel Sibley & Sajovec

(57) ABSTRACT

A semiconductor structure and a bonding method are disclosed that includes a device wafer, a substrate wafer, and a metal bonding system between the device wafer and the substrate wafer. The metal bonding system includes gold, tin, and nickel, and includes at least one discrete layer of gold and tin that is at least about 88 percent gold by weight.

25 Claims, 5 Drawing Sheets

U.S. PATENT DOCUMENTS

| | | |
|---|---|---|
| 2006/0060879 A1 | 3/2006 | Edmond |
| 2006/0061974 A1 | 3/2006 | Soga et al. |
| 2006/0128118 A1 | 6/2006 | Nagahama et al. |
| 2006/0163590 A1 | 7/2006 | Erchak et al. |
| 2006/0189098 A1 | 8/2006 | Edmond |
| 2007/0141806 A1 | 6/2007 | Uemura et al. |
| 2008/0003777 A1 | 1/2008 | Slater et al. |

OTHER PUBLICATIONS

International Search Report of foreign counterpart application No. PCT/US2008/072855, Dec. 3, 2008, 3 pages.

Labie et al., "Solid state diffusion in Cu-SN and Ni-Sn diffusion couples with flip-chip scale dimensions," Intermetallics 15, Sep. 26, 2006, pp. 396-403.

Lee et al, "Study of Ni as a barrier metal in AuSn soldering application for laser chip.submount assembly," J. Appl. Phys., vol. 72, No. 8, Oct. 15, 1992, pp. 3808-3815.

Correspondence dated Jul. 8, 2010 from Japanese associate forwarding office action Japanese Patent Application No. 2007-171846, 3 pages.

Neumann et al., "The Ternary System Au-Ni-Sn," 1996, Journal of Solid State Chemistry, 123, pp. 203-207.

Hsu et al., "Phase equilibria of the Sn-Ag-Ni ternary system and interfacial reactions at the Sn-Ag/Ni joints," 2004, Acta Materialia, 52, pp. 2541-2547.

* cited by examiner

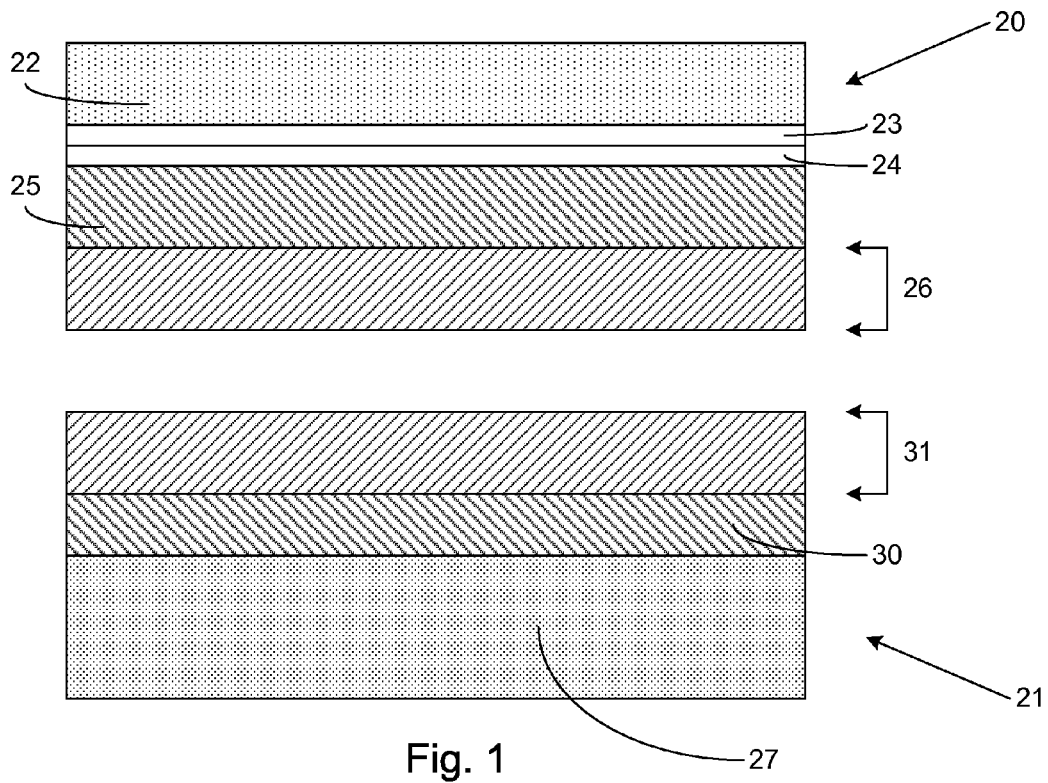
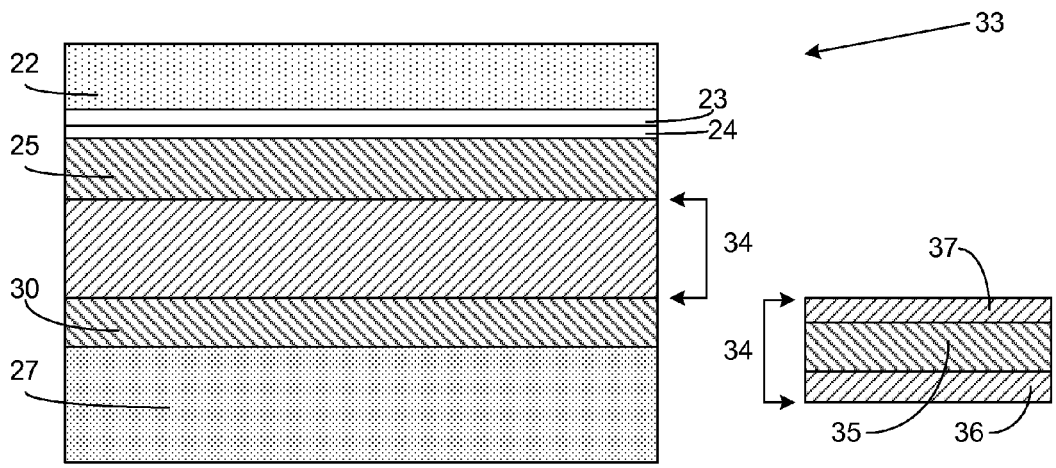
Fig. 1
Fig. 2

MODIFIED GOLD-TIN SYSTEM WITH INCREASED MELTING TEMPERATURE FOR WAFER BONDING

BACKGROUND

The present invention relates to the structure and composition of metal bonding systems used to attach substrate wafers carrying light emitting diodes (LEDs) to other substrate wafers during LED manufacture. This application is related to Ser. No. 11/428,158 filed Jun. 30, 2006 for "Nickel Tin Bonding System For Semiconductor Wafers And Devices."

Light emitting diodes (LEDs) are a class of photonic semiconductor devices that convert an applied voltage into light by encouraging electron-hole recombination events in an appropriate semiconductor material. In turn, some or all of the energy released in the recombination event produces a photon.

A typical LED includes p-type and n-type epitaxial layers ("epilayers") that form a p-n junction for the current injection to produce the recombination events. These epilayers are typically grown on a substrate of the same or a different semiconductor. Epilayers can be produced with relatively high crystal quality and thus enhance the quality and operation of the resulting devices. The substrate portion of the device may not require the same level of quality, or in some cases, substrates formed of the same material as one or more of the epilayers are not easily available (or available at all).

Because of their wide bandgap and direct transition characteristics, the Group III nitride materials are favored for shorter wavelength light emitting diodes; i.e., those that emit in the blue, violet, and ultraviolet portions of the electromagnetic spectrum. The Group III nitride materials can, either in conjunction with diodes of other colors or with phosphors, produce white light. At the same time, Group III nitride substrate crystals of an appropriate size and quality are difficult or impossible to obtain. As a result, LEDs based on the Group III nitride material system typically include Group III nitride epilayers on sapphire or silicon carbide (SiC) substrates.

For a number of reasons, when the epitaxial layers of light-emitting semiconductor materials are formed (typically by chemical vapor deposition ("CVD") growth) on a substrate, the resulting precursor structure is also added to an additional substrate. The second substrate may be other than a semiconductor or if it is a semiconductor, it is not necessarily present for semiconducting purposes. For example, in commonly assigned and co-pending U.S. Patent Application Publication No. 20060060877, a second substrate is used for mounting and fabrication purposes and to form a portion of a final LED structure. No. 20060060877 is incorporated entirely herein by reference. As set forth therein and elsewhere, the manufacture of certain types of LEDs includes one or more steps to reduce the thickness of the original substrate (e.g., because the original substrate is thicker in order to make the initial manufacturing steps easier). Related background is set forth in commonly assigned U.S. Patent Application Publications Nos. 20060049411, 20060060872, 20060060874, and 20060060879, and the contents of each of these is likewise incorporated entirely herein by reference.

In other structures, light emitting diodes are mounted to second sets of substrates in order to reverse (flip) their normal orientation. Stated differently, in a typical orientation, the substrate is mounted to a lead frame and the epitaxial layers form the emitting face of the LED. In a flip chip orientation, however, the epitaxial layers are mounted towards the lead frame and the substrate provides the light emitting surface of the LED. Various steps in the process of manufacturing such flip chip diodes can require that the LED-carrying substrate wafer be joined to another substrate wafer either temporarily or permanently. In some flip-chip embodiments, the LED-carrying substrate wafer is removed from the epitaxial layers after the epitaxial layers are mounted to the temporary or permanent substrate wafer.

The conventional manner of joining the LED-carrying substrate wafer to another substrate wafer includes the use of various metal layers in a manner either identical or analogous to soldering or brazing. In many circumstances, a layer of titanium is deposited onto the respective surfaces to be joined, and then additional layers of bonding metals are added to form a bonding metal structure on each of the first and second substrates (sometimes referred to as the donor and acceptor substrates).

For number reasons, gold (Au) has historically been a predominant element in these bonding metal layers, often in the form of a gold-tin (Au—Sn) combination (including alloys) that is about 80:20 (Au:Sn) by weight. Gold is highly malleable, ductile and flexible and can be formed in extremely thin layers. Because it resists oxidation and other chemical reactions (which makes it, of course, historically valuable for jewelry and related items), gold also is attractive for its corrosion resistance; i.e., avoiding undesired reaction with its surroundings. Its malleability and a relatively moderate melting point (with respect to other metals), makes it ideal for soldering purposes.

These soldering steps require some application of heat. Thus, a soldering step used to join an LED substrate wafer to a second substrate wafer will heat the LEDs to some extent. As is well understood by those of ordinary skill in this art, whenever the temperature of the light emitting semiconductor epitaxial layers is raised, the probability is correspondingly raised that defects will be generated in the epitaxial layers. Typically, gold-tin based soldering (bonding, brazing) systems require temperatures above about 300° C. Although epitaxial layers of, for example, Group III nitride materials, can theoretically withstand such temperatures, in reality these temperatures significantly increase the probability that the bonding step will generate noticeable defects.

As yet an additional factor, when individual LEDs are separated from a wafer and mounted on a lead frame (e.g., a "die attach" to form a lamp), they are typically mounted on the lead frame with another soldering step. If the LED already contains a solder bond (i.e., between the device and substrate wafers), the existing solder bond should desirably remain unaffected by the temperatures required to solder the entire chip to the lead frame. Thus, the temperature at which the LED can be soldered to the lead frame will be limited by the temperature that the substrate-substrate bond can withstand without melting. Stated differently, the thermal characteristics of the substrate-substrate bonding metallurgy may unfavorably limit the type of solder that can be used to join an individual LED to an individual lead frame.

In particular, a pure 80:20, Au:Sn combination will tend to melt at temperatures above about 280° C. Thus, if the lead frame (or equivalent mounting) solder requires a temperature above 280° C., the possibility exists that the substrate bonding system may melt and fail.

Accordingly, a need exists for increasing the thermal capabilities of the substrate bonding system in a manner that complements or enhances, rather than limits, the die attach steps and that minimizes or eliminates adverse effects on the epitaxial layers.

SUMMARY

In one aspect, the invention is a semiconductor structure that includes a device wafer, a substrate wafer, and a metal bonding system between the device wafer and the substrate wafer in which the metal bonding system comprises gold, tin, and nickel, and including at least one discrete layer of gold and tin that is at least about 88 percent gold by weight.

In another aspect, the invention is a semiconductor structure in which all of the gold-tin layers include at least 88 percent gold by weight.

In another aspect, the invention is the semiconductor structure with a metal bonding system between the device wafer and the substrate wafer in which the metal bonding system comprises a discrete layer that predominates in gold by weight and that demonstrates melting temperatures exceeding 350° C.

In another aspect, the invention is a method of bonding substrate wafers and device wafers to one another comprising annealing a gold-tin alloy that predominates by weight in gold in the presence of an adjacent layer of nickel until the nickel and tin react to a extent sufficient to increase the weight percentage of gold in the gold-tin alloy to at least about 88 percent.

In yet another aspect, the invention is a method of bonding substrate wafers and device wafers comprising annealing a gold-tin alloy that predominates in weight in gold in the presence of an adjacent layer of nickel until the nickel and tin react to an extent sufficient to increase the melting temperature of the gold-tin alloy to more than 350° C.

In yet another aspect, the invention is a method of bonding substrate wafers and device wafers comprising depositing a layer of nickel on at least the device wafer and thereafter depositing a layer of gold-tin alloy (or discrete layers that will form the alloy) on the nickel layer characterized by applying a relative thickness of each layer that provides upon annealing a discrete gold-tin layer that includes at least about 88 percent by weight gold.

In yet another aspect, the invention is a light emitting diode that includes a device portion, a substrate portion, and a metal bonding system between the device portion and the substrate portion. The metal bonding system includes at least one layer of gold-tin alloy in which gold is present in an amount of at least about 88 percent by weight.

The foregoing and other objects and advantages of the invention and the manner in which the same are accomplished will become clearer based on the followed detailed description taken in conjunction with the accompanying drawings.

BRIEF DESCRIPTION OF THE DRAWINGS

FIG. 1 is a schematic cross-sectional view of a device wafer and a substrate wafer incorporating metal bonding systems according to the present invention.

FIG. 2 is a cross-sectional schematic diagram of joined wafers incorporating the metal bonding system according to the present invention.

DETAILED DESCRIPTION

Figure 3:
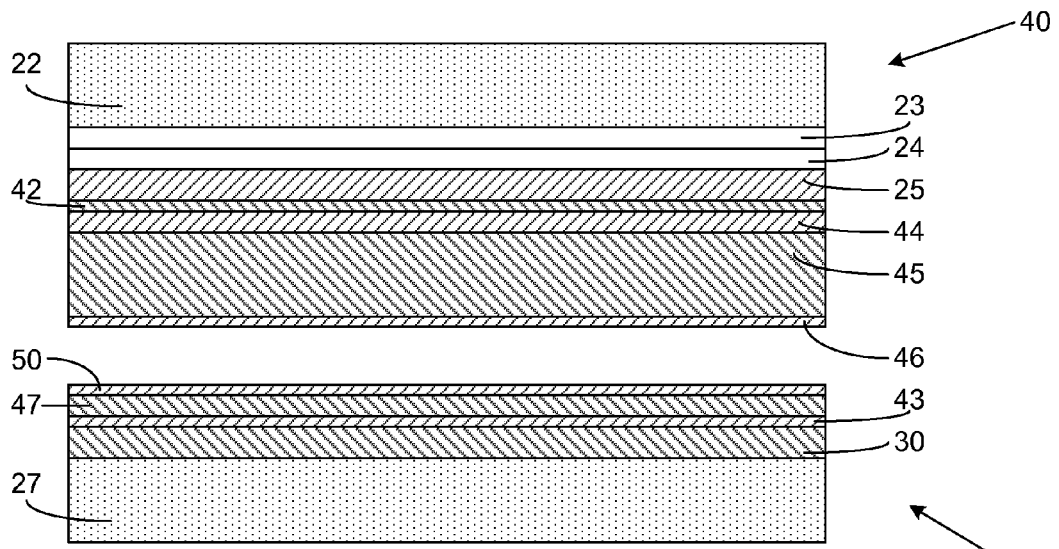
FIGS. 3, 4, and 5 are more detailed cross-sectional schematic diagrams of substrates and metal bonding systems according to the present invention.

In a first aspect the present invention is a semiconductor structure comprising a device wafer, a substrate wafer, and a metal bonding system between the device wafer and the substrate wafer that includes gold (Au), tin (Sn), and nickel (Ni) and that includes at least one discrete layer of gold and tin that is at least about 88 percent gold by weight. FIGS. 1 and 2 illustrate this aspect of the invention in schematic fashion. In FIG. 1, a device wafer is broadly designated at 20 and a substrate wafer is broadly designated at 21. FIG. 1 illustrates the device wafer 20 as including a substrate material 22 and respective epitaxial layers 23 and 24. Because the method and structure of the invention are often used in producing light emitting diodes, the Figures will be described in this context. It will be understood, however, that the invention is not necessarily limited to such context. Those familiar with this art will recognize, of course, that the active portion in a light emitting diode can include a plurality of layers for various purposes including heterojunctions, superlattice structures and multiple quantum wells.

It will likewise be understood that FIG. 1 (and FIGS. 2 and 3) are sized for illustration purposes rather than literal proportional accuracy. As will be described later herein, some of the illustrated layers are in reality several orders of magnitude different from one another in thickness, and attempting to illustrate such literally would decrease, rather than increase the clarity of this description.

As set forth in the Background, it will be understood that an epitaxial layer or LED-carrying substrate wafer can be bonded to another substrate for a variety of purposes and in a variety of respective orientations with respect to the location of epitaxial layers or devices. Thus, although FIG. 1 illustrates the respective substrates 20 and 21 as being joined in a certain position with respect to the light emitting layers 23 and 24, FIG. 1 is exemplary rather than limiting of the manner in which the invention can be used. It should be understood that as used herein the term substrate wafer can include the epitaxial layers on the growth substrate, the epitaxial layers on a different temporary or permanent substrate, or the epitaxial layers themselves (with the substrate removed) bonded to another substrate.

The substrate material 22 is often selected from the group consisting of silicon carbide (SiC) or sapphire ($Al_2O_3$) and the epitaxial layers include Group III nitride materials. As set forth in the background, the nature of light emitting diodes, Group III nitrides, and sapphire and silicon carbide substrates, are generally well understood in this art and need not be described in detail herein. Appropriate references include SZE, PHYSICS OF SEMICONDUCTOR DEVICES, 2d Edition (1981); SCHUBERT, LIGHT-EMITTING DIODES, Cambridge University Press (2003) and, ZETTERLING, PROCESS TECHNOLOGY FOR SILICON CARBIDE DEVICES, Electronic Materials Information Service (2002).

The term Group III nitride is used herein in its usual sense; i.e., to refer to binary, ternary, and quaternary compounds of Group III elements—most commonly gallium (Ga), aluminum (Al), and indium (In)—with nitrogen (N) in a relationship in which the atomic fraction of all of the Group III nitrides and the nitrogen are 1:1. The selection of particular Group III nitride compositions for any one or more of the layers of the light emitting diodes is well understood in the art and thus need not be described in detail with respect to the present invention.

The device wafer 20 will typically include a contact metal or metal system 25 with the term "contact" referring to the choice of a metal or other material that has ohmic characteristics with respect to the epitaxial (or other) layer with which it comes into contact. Thus although FIG. 1 symbolizes the contact metals by the single layer 25, they can include a plurality of layers, each of which can form a single metal or alloy. In the majority of light emitting diode structures, the metal contacts 25 will be selected on the basis of their ohmic character with respect to either p-type or n-type material (substrate or epitaxial layer). Once an appropriate ohmic contact is made between the metal and the semiconductor, other metals can be included in the contact layer 25 for purposes such as corrosion resistance, lower-cost, or ease of manufacture.

In some cases, the ohmic contact can also be reflective or transparent, provided that the relevant metal is otherwise compatible with the remainder of the structure and its function.

Figure 4:
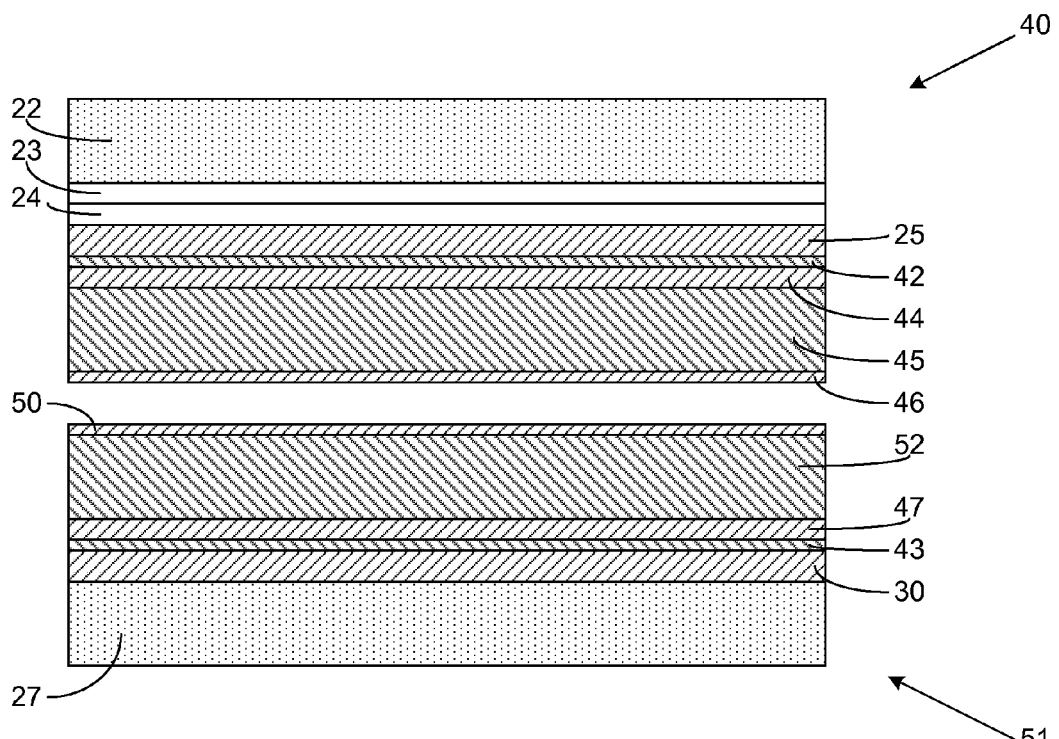
Figure 5:
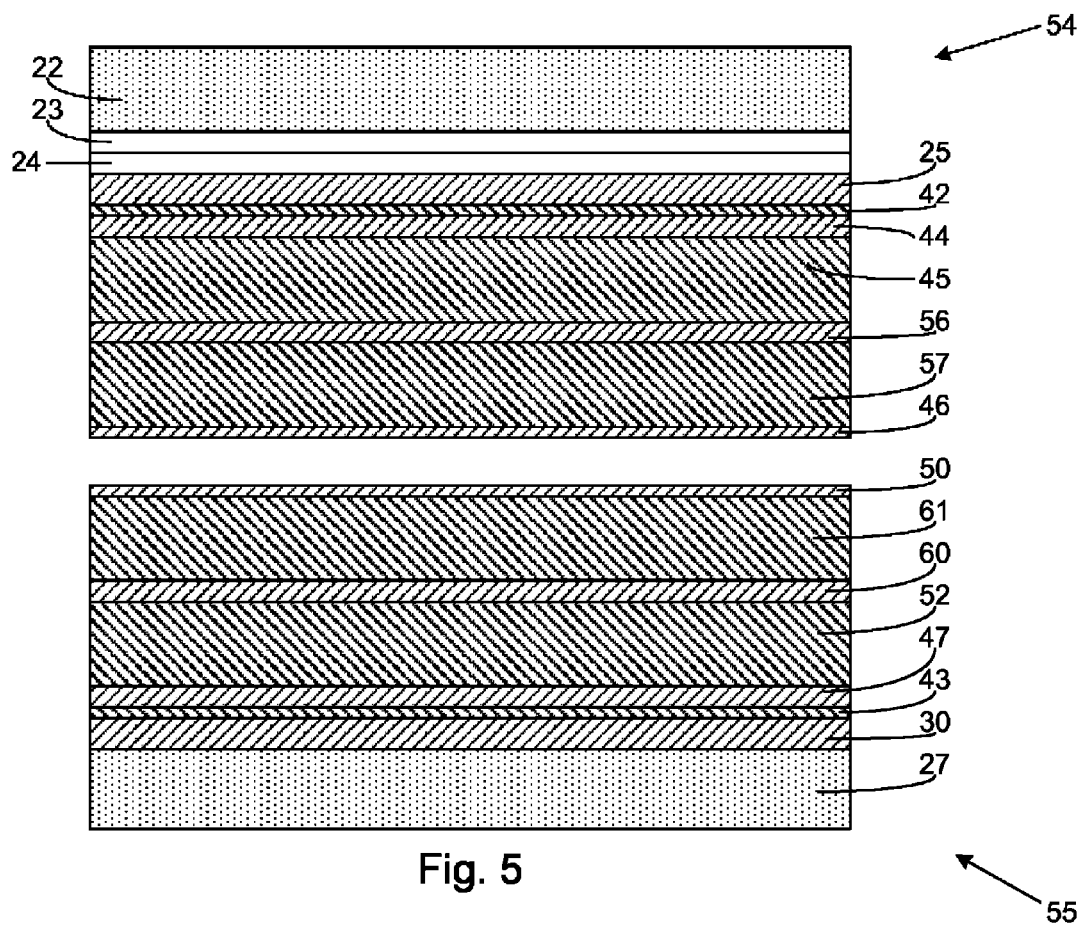

The device wafer 20 includes metal bonding layers designated by the bracketed arrows 26 and described in more detail with respect to FIGS. 3, 4 and 5. The bonding metal system is selected for its physical bonding capabilities while being consistent and compatible with both the contact metals 25 and the overall structure and operation of the devices formed in or from the wafer 20.

The substrate wafer 21 likewise includes a substrate material 27 which, because the substrate wafer does not carry devices, can be selected from the same materials as the device substrate material 22 or other or additional materials such as ceramics, composites, metals, or polymers, again provided they are consistent with the overall method steps and the intermediate and resulting structures. In many cases in order to have a favorable device geometry, the substrate material 27 will be electrically conductive and thus will include its own contact metals indicated again by a single layer 30 for the same purposes as discussed with the contact metals 25 on the device substrate 20.

In order to join the substrate wafer 21 to the device wafer 20, the substrate wafer 21 also carries a bonding metal system designated by the bracketed arrows 31. Again, these will be described in more detail with respect to FIGS. 3, 4, and 5, but can be the same as or somewhat different from the bonding metals 26 on the device wafer 20.

FIG. 2 illustrates a semiconductor structure broadly designated at 33 according to the invention and produced after the wafers 20 and 21 are joined together. A number of the elements illustrated in FIG. 2 are the same as those illustrated in FIG. 1 and thus carry the same reference numerals. These include the respective substrate materials 22 and 27, the epitaxial layers 23 and 24, and the respective contact metals 25 and 30. FIG. 2 also includes a breakaway detail view of the metal bonding system 34

When the wafers 20 and 21 are joined and annealed as described herein with respect to the method, they produce the metal bonding system 34 that comprises gold, tin, and nickel. When joined, the metal bonding system will include at least one discrete layer 35 that is at least about 88 percent by weight gold. Because the annealing takes place in the presence of at least one adjacent layer of nickel (e.g. FIGS. 3, 4 and 5), the metal bonding system 34 will also typically include at least one discrete layer 36 of a combination of nickel, gold, and tin adjacent the discrete high percentage gold layer 35 with tin being present in the discrete nickel-gold-tin layer in an amount of about 40 percent by weight.

In most embodiments, the semiconductor structure 33 will include at least a second discrete layer 37 of nickel-gold-tin and in which the two nickel-gold-tin layers 36 and 37 are separated by the layer 35 of 88 percent gold.

Although FIGS. 1 and 2 illustrate the bonding systems the in a most basic sense for clarity purposes, it will be understood that the bonding system 34 could include a plurality of (at least about) 88 percent by weight gold layers and more than two of the nickel-tin-gold layers. When more than one gold-tin layer is present, all of the gold-tin layers include at least 88 percent gold by weight.

In another aspect, the invention can be described in terms of the favorable thermal characteristics of the bonding metal system. In this context, and again referring to FIG. 2, the metal bonding system 34 comprises a discrete layer 35 that predominates in gold by weight and it demonstrates melting temperatures exceeding 350° C. Similarly, the bonding system will typically further comprise at least one, and usually two layers 36, 37 each of which is a combination of nickel, gold, and tin that demonstrates melting temperatures exceeding 350° C.

The invention is also understood in terms of the precursor structures that form the bonding metal system when annealed and these precursor structures are described in more detail with respect to FIGS. 3, 4 and 5. A number of the elements in FIGS. 3, 4 and 5 are the same as those in FIGS. 1 and 2 and thus where appropriate, they will carry the same reference numerals.

Accordingly, FIG. 3 illustrates a device wafer 40 and a substrate wafer 41. Common elements with respect to FIGS. 1 and 2 include the respective substrate materials 22 and 27, the contact metals 25 and 30, and the epitaxial layers 23 and 24. The bonding metal systems are, however, illustrated in more detail. In particular, FIG. 3 illustrates an asymmetrical metal bonding system that includes respective adhesive metal layers 42 and 43, typically formed of titanium, on each of the respective contact metal layers 25 and 30. The device wafer 40 includes a nickel layer 44 on the titanium adhesion layer 42 and then a significantly thicker layer 45 of a gold-tin combination or alloy which is usually deposited in an 80/20 proportion (gold/tin) by weight. A flash layer 46 typically formed of gold completes the precursor bonding system on the device wafer 40.

The substrate wafer 41 is, as noted above, asymmetric in its bonding metal system precursor layers as compared to the device wafer 40. FIG. 3 illustrates a relatively simple structure that includes the titanium adhesion layer 43, a layer of nickel 47, and a flash layer 50, again typically formed of gold.

It will be understood that FIGS. 1 through 5 are illustrative rather than limiting of the manner in which specific layers can be used or arranged to produce the metal bonding system of the invention. For example, FIG. 3 shows an asymmetric structure in which a single gold-tin layer 45 is present on the device wafer 40, but not on the substrate wafer 41. In other embodiments such a discrete nickel layer (or its equivalent) could be present on the substrate wafer 41 and absent from the device wafer 40.

FIG. 4 illustrates a symmetrical system; i.e., one in which the precursor bonding metal layers are identical on both the device wafer (again designated at 40) and the substrate wafer (designated as 51). Accordingly, all of the elements in the device wafer 40 are the same and carry the same reference numerals as in FIG. 3. The substrate wafer, however, now includes an additional layer 52 of gold-tin alloy and again in an 80/20 proportion by weight percentage.

FIG. 5 is another example of a symmetrical bonding system but with multiple layers of gold-tin alloy as the starting materials. FIG. 5 illustrates a device wafer 54 and a substrate wafer 55 in which common elements previously described retain their previous reference numerals. In comparison to FIG. 4, however, the device wafer 54 includes a second layer 56 that is predominantly or entirely nickel and likewise a second layer 57 of the 80/20 weight percentage gold/tin alloy.

Similarly, the substrate wafer 55 includes a second layer that is predominantly or entirely nickel 60 and a second layer 61 of the 80/20 gold-tin alloy by weight percentage.

Whenever possible, the overall metal bonding structure, including the layers of a plurality of metals as illustrated in FIGS. 3-5, should be greater than 50 percent by weight gold.

Figure 6:
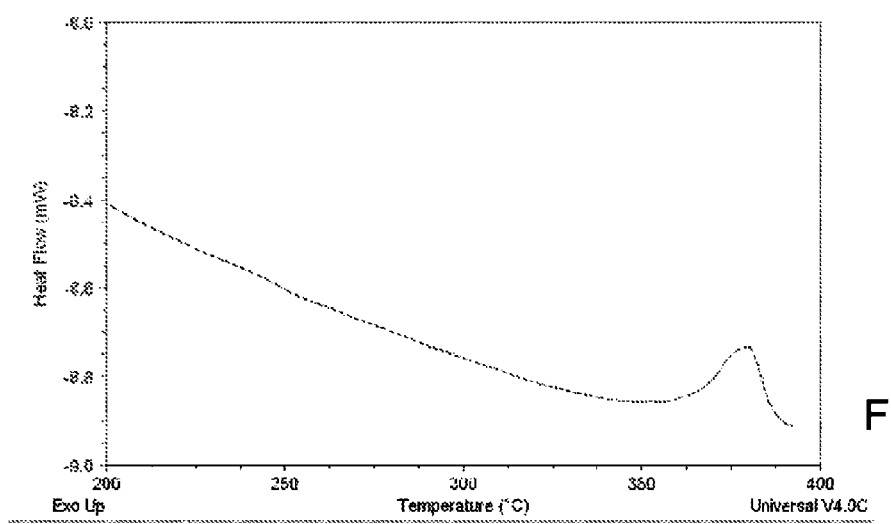
FIG. 6 is a plot from a differential scanning calorimeter illustrating characteristics of metal bonding systems according to the invention.
Figure 7:
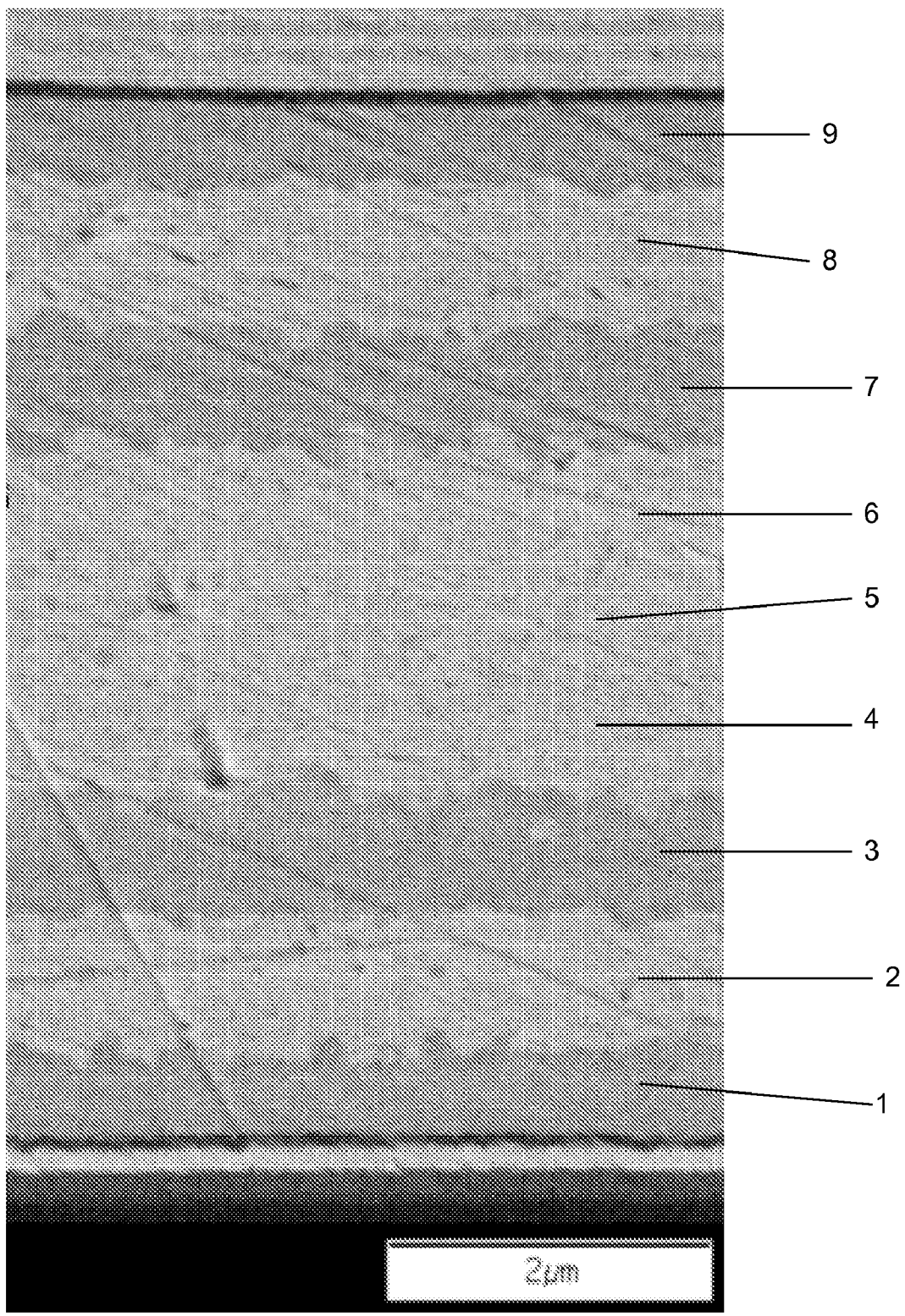
FIG. 7 is a scanning electron microscope photograph of a metal bonding system according to the invention.

FIGS. 6 and 7 represent experimental data from structures with bonding systems according to the present invention. FIG. 6 is a plot from a differential scanning calorimeter, the use and operation of which (and the interpretation of resulting data) is well understood by those of ordinary skill in this art. As set forth in FIG. 6, when the appropriate analysis is carried out on a metal bonding system according to the invention, the metal bonding system remains stable (solid) at temperatures exceeding 350° C. As noted elsewhere herein, this provides the metal bonding system with the capability of withstanding other process temperatures—the most typical of which is soldering a diode to a lead frame—of up to 350° C.

FIG. 7 is a scanning electron microscope photograph of a bonding system according to the present invention. The respective layers were analyzed by standardless mode energy dispersive x-ray spectroscopy (EDX) and the numerals in FIG. 7 correspond to the composition set forth in Table 1 (where the "Nickel" spaces are blank, nickel may be absent from the respective layer, or present in amounts below the detection limit of EDX):

TABLE 1

| Layer | Nickel | Tin | Gold |
|---|---|---|---|
| 9 | 14.0 | 43.6 | 42.4 |
| 8 |  | 6.7 | 93.3 |
| 7 | 13.6 | 46.2 | 40.2 |
| 6 |  | 5.5 | 94.5 |
| 5 |  | 6.3 | 93.7 |
| 4 |  | 5.8 | 94.2 |
| 3 | 10.8 | 44.1 | 45.1 |
| 2 |  | 7.4 | 92.6 |
| 1 | 15.8 | 46.0 | 38.2 |

Figure 8:
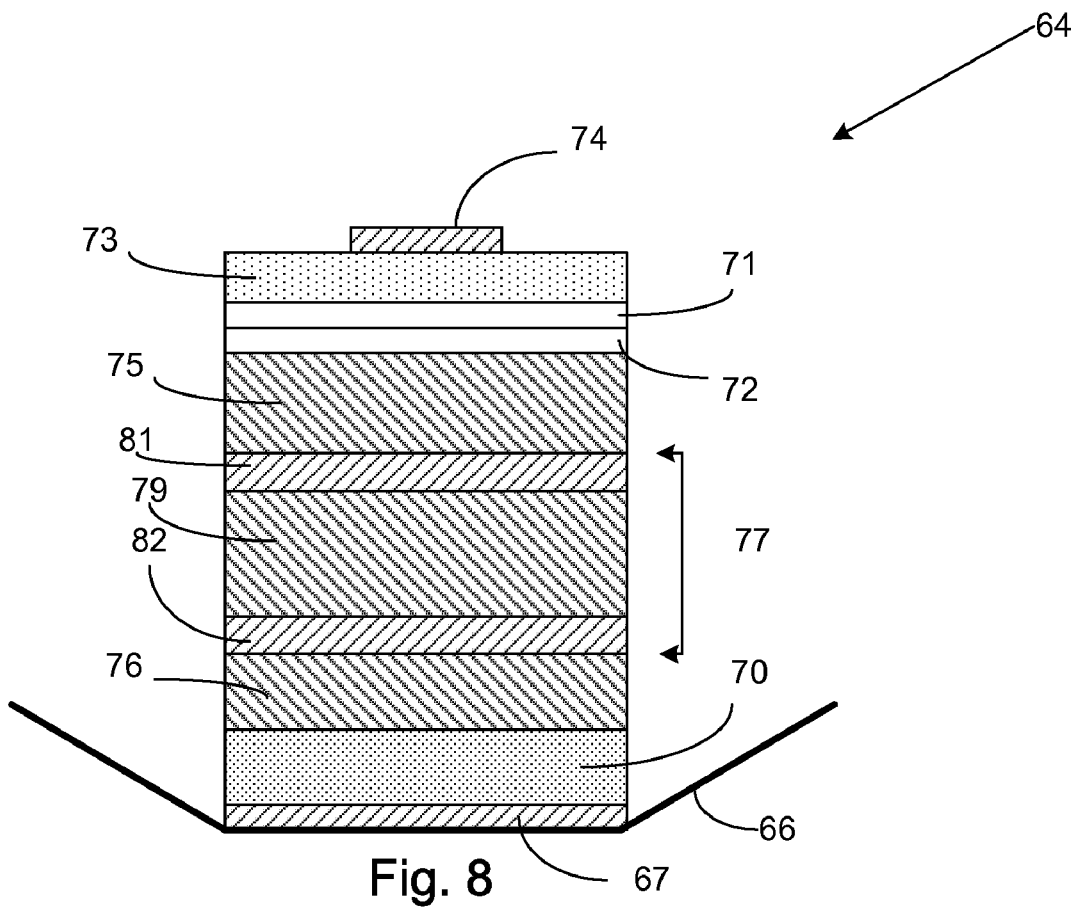
FIGS. 8 and 9 are cross-sectional schematic diagrams of light emitting diodes according to the present invention.
Figure 9:
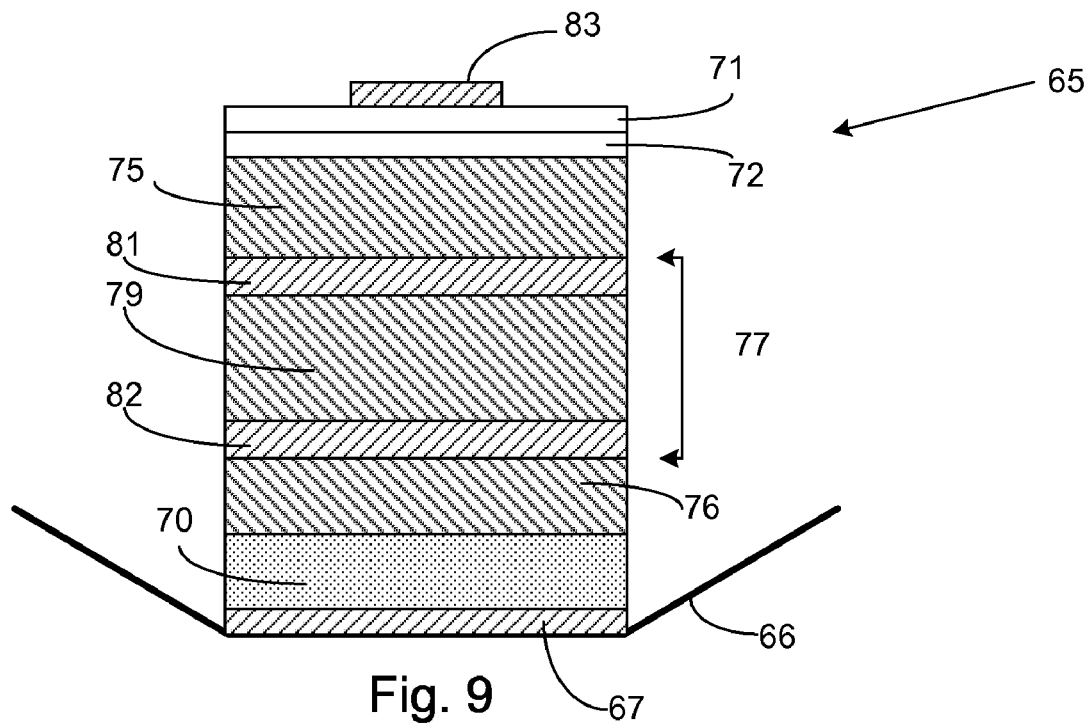

FIGS. 8 and 9 are cross-sectional schematic diagrams of light emitting diodes according to the present invention. In FIG. 8 the diode is broadly designated at 64 and in FIG. 9 at 65. In FIG. 8, the diode 64 is shown mounted on a lead frame 66 in conjunction with an ohmic contact 67. As noted earlier herein, if the substrate material 70 is conductive, the resulting diode 64 can potentially have the vertical orientation (ohmic contacts axially opposite one another) illustrated in FIGS. 8 and 9. Alternatively, if the substrate material 70 is not conductive, the ohmic contact will be made to some other respective conductive portion of the device. These alternative designs are well understood in the art and will not be described in detail herein.

The light emitting diode 64 includes at least two epitaxial layers 71 and 72 that schematically represent the active portion of the device. As well understood, these will typically include at least one n-type layer and one p-type layer in order to provide current injection across the resulting p-n junction with the accompanying recombination of electrons and holes and emission of the desired photons.

In FIG. 8, the diode 64 is in a "flip-chip" orientation in which the original growth substrate material 73 forms one of the uppermost layers (and potentially the uppermost layer) of the diode and meets the ohmic contact 74. Contact metal layers 75 and 76 are included as described previously and the metal bonding system is designated by the bracketed arrow 77. As described earlier, and particularly with respect to FIG. 2 and the photograph of FIG. 7, in the finished diode 64 the metal bonding system includes at least one layer 79 of a gold-tin alloy in which gold is present in an amount of at least about 88 percent by weight. Furthermore, the metal bonding system 77 will likewise include one, and potentially two of the layers 81, 82 of nickel-gold-tin alloy. In FIG. 8 the nickel-gold-tin alloy layers 81 and 82 are separated by the gold-tin alloy layer 79.

FIG. 9 illustrates a diode 64 in which all of the elements are respectively the same as those in FIG. 8, with the exception that the diode illustrated in FIG. 9 does not include the original growth substrate. Thus, the ohmic contact is designated at 83 to symbolize that it is in direct contact with the active structure epitaxial layers 71 and 72. As a result, and because different semiconductor materials and different metals have different ohmic characteristics with respect to one another, the ohmic contact 83 may be (although is not necessarily) a different metal than the ohmic contacts 74 of the substrate-containing diode 64 in FIG. 8.

Those familiar with this art will recognize that other elements are typically included when an LED such as 64 or 65 is added to a lead frame. These can include solders, adhesives and in many cases a polymer lens that encapsulates the diode 64 or 65 on the lead frame.

In all of the disclosed embodiments of wafers and diodes, it will be understood that various additional elements may be present that have not been described in detail herein as would be understood by one of skill in the art. For example, the titanium adhesion layers (i.e., elements 42 and 43 in FIGS. 3-5) and the gold flash layers are typically used in such structures, but different materials, less or additional layers using these or other materials are possible. Similarly, because the structures can differ somewhat, terms such as "on" or "above" can refer in context to the relative positions of materials with respect to one another rather than to direct physical contact between such layers. Thus, in FIGS. 8 and 9, for example, the ohmic contacts are said to be "on" various portions of the diodes and it will be understood that if some other intervening layer was included, it would still fall within the description and claims herein. For example, the invention has been described relative to a particular "flip-chip" orientation; however, the bonding system and method described herein can be used with a variety of orientations. Additionally, the bonding system and method could be used in a system where the epitaxial layers are bonded directly top a leads frame or mounting structure.

In another aspect, the invention is a method of bonding substrate wafers and device wafers to one another comprising annealing a gold-tin alloy that predominates by weight in gold in the presence of an adjacent layer of nickel until the nickel and tin react to an extent sufficient to increase the weight percentage of gold in the gold-tin alloy to at least about 88 percent.

The annealing step is typically carried out at temperatures of between about 280 and 320° C. and typically at a temperature of about 300° C.

The method can further comprise cutting the bonded wafers into individual devices (or "die") and then soldering the individual devices to a lead frame or an equivalent mounting structure. The cutting step is generally well understood in the art and can be carried out conventionally provided it does not otherwise interfere with the structure or operation of the resulting devices.

Because of the improved thermal characteristics of the metal bonding system of the invention, individual devices can be soldered to lead frames at temperatures above about 325° C., or above about 340° C., and in some cases above 350° C.

As with respect to the structural aspects, the method can be expressed in terms of annealing the gold-tin alloy in the presence of the adjacent layer of nickel until the nickel and tin react to an extent sufficient to increase the melting temperature of the gold-tin alloy to more than 350° C. Likewise, the method can include annealing the gold-tin alloy until the nickel and tin and gold react to an extent sufficient to produce a nickel-gold-tin alloy with a melting temperature greater than 350° C.

In yet another aspect, the method can comprise depositing a layer of nickel on at least a device wafer and thereafter depositing a layer of gold-tin alloy on the nickel layer, characterized by applying a relative thickness of each layer that upon annealing provides a discrete gold-tin layer that includes at least about 88 percent by weight gold.

In this respect, the density of the respective metals is well-established. Thus, the desired relative amount by weight of each metal can be calculated based upon the area over which the metal is applied and the metal's density (gold is 19.3 grams per cubic centimeter (g/cm$^{-3}$), tin is 7.3 g/cm$^{-3}$, and nickel is 8.9 g/cm$^{-3}$). Accordingly, although specific thicknesses are described and disclosed herein, they are exemplary rather than limiting of the invention. That said, in the embodiments described herein, the titanium adhesion layers are typically about 100 nanometers (nm) thick, the nickel layers are typically 200 nm thick, the gold-tin layers are between 1.5 and three microns (μm) thick, and the gold flash layers are between about 50 and 100 angstoms (Å) thick. When applied as discrete layers and prior to the annealing step, these metal layers are typically (but not necessarily) added by sputtering.

In the ultimate method step, the substrate wafer and device wafer are brought into contact with each other with the respective nickel and gold-tin layers on each respective wafer facing each other. Thereafter, the contacting wafers are annealed to form a metal bond between the substrate wafer and the device wafer. The annealing temperatures can be (and typically will be) the same as those set forth above.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A semiconductor structure comprising:
    a device wafer;
    a substrate wafer; and
    a metal bonding system between said device wafer and said substrate wafer; said metal bonding system comprising gold, tin, and nickel, and including at least one discrete layer of gold and tin that is at least about 88 percent gold by weight.

2. A semiconductor structure according to claim 1 wherein said metal bonding system includes at least one discrete layer of a combination of nickel, gold and tin adjacent said at least 88 percent gold discrete layer, with tin being present in said discrete nickel-gold-tin layer in an amount of about 40 percent by weight.

3. A semiconductor structure according to claim 2 comprising at least two of said discrete layers of nickel gold and tin separated by said 88 percent gold discrete layer.

4. A semiconductor structure according to claim 1 wherein said device wafer includes at least one epitaxial layer.

5. A semiconductor structure according to claim 4 wherein said epitaxial layer is a Group III nitride.

6. A semiconductor structure according to claim 1 wherein said device wafer includes a substrate selected from the group consisting of silicon carbide and sapphire.

7. A semiconductor structure according to claim 1 comprising a plurality of discrete gold-tin layers each of which is at least about 88 percent gold by weight.

8. A semiconductor structure according to claim 7 wherein all of said discrete gold-tin layers are at least about 88 percent gold by weight.

9. A semiconductor structure according to claim 1 wherein the overall metal bonding system is greater than 50 percent by weight gold.

10. A semiconductor structure comprising:
    a device wafer;
    a substrate wafer; and
    a metal bonding system between said device wafer and said substrate wafer, said metal bonding system comprising a discrete layer of gold and tin that predominates in gold by weight and that demonstrates melting temperatures exceeding 350° C.

11. A semiconductor structure according to claim 10 wherein said metal bonding system further comprises at least one discrete layer of a combination of nickel, gold and tin that demonstrates melting temperatures exceeding 350° C.

12. A semiconductor structure according to claim 11 comprising at least two of said nickel, gold and tin layers separated by said gold predominating layer.

13. A semiconductor structure according to claim 10 wherein said device wafer includes at least one epitaxial layer.

14. A semiconductor structure according to claim 13 wherein said epitaxial layer is a Group III nitride.

15. A semiconductor structure according to claim 10 wherein said device wafer includes a substrate selected from the group consisting of silicon carbide and sapphire.

16. A semiconductor structure according to claim 10 comprising a plurality of discrete gold-tin layers each of which is at least about 88 percent gold by weight.

17. A semiconductor structure according to claim 16 wherein all of said discrete gold-tin layers are at least about 88 percent gold by weight.

18. A light emitting diode comprising:
    a device portion;
    a substrate portion; and
    a metal bonding system between said device portion and said substrate portion, said metal bonding system including at least one layer of gold-tin alloy in which gold is present in an amount of at least about 88 percent by weight.

19. A light emitting diode according to claim 18 wherein the overall metal bonding system is greater than 50 percent by weight gold.

20. A light emitting diode according to claim 18 comprising a plurality of layers of gold-tin alloy in which gold is present in an amount of at least about 88 percent by weight.

21. A light emitting diode according to claim 18 wherein all of said gold-tin layers are at least about 88 percent gold by weight.

22. A light emitting diode according to claim 18 wherein said device portion comprises epitaxial layers of semiconductor material.

23. A light emitting diode according to claim 22 further comprising a device substrate material on said epitaxial layers.

24. A light emitting diode according to claim 22 wherein said epitaxial layers comprise Group III nitride materials.

25. A light emitting diode according to claim 22 wherein said device substrate material is selected from the group consisting of silicon carbide and sapphire.

* * * * *